United States Patent [19]
Chang et al.

[11] Patent Number: 5,996,962
[45] Date of Patent: Dec. 7, 1999

[54] COMPUTER CARD RETAINER AND PROCESS FOR USING THE SAME

[76] Inventors: Tommy H. C. Chang, 229 Pasqual La., San Gabriel, Calif. 91775; Michael Chen, 1654 No. Santa Anita Ave., Arcadia, Calif. 91006; Ming Chen, 10896 Pope St., Manassas, Va. 20109; Winfred Wu, 3805 Lake Blvd., Annandale, Va. 22003; Wei-Liang William Chu, 722 Leyland Dr., Diamond Bar, Calif. 91765

[21] Appl. No.: 09/080,151

[22] Filed: May 18, 1998

[51] Int. Cl.⁶ .......................... H01R 13/639; H05K 7/14
[52] U.S. Cl. ............................................. 248/694; 361/759
[58] Field of Search ..................................... 248/682, 689, 248/690, 205.3, 222.11, 351, 354.7, 505, 292.12, 292.13; 211/41.17; 361/759, 801, 802; 439/62, 327

[56] References Cited

U.S. PATENT DOCUMENTS

| | | | |
|---|---|---|---|
| 4,890,198 | 12/1989 | Beam et al. | 361/752 |
| 5,383,793 | 1/1995 | Hsu et al. | 439/327 |
| 5,457,608 | 10/1995 | Scholder et al. | 361/752 |
| 5,472,353 | 12/1995 | Hristake et al. | 439/327 |
| 5,603,628 | 2/1997 | Schapiro, Jr. | 439/327 |
| 5,623,396 | 4/1997 | Blackwell | 361/801 |
| 5,822,193 | 10/1998 | Summers et al. | 361/759 |

*Primary Examiner*—Ramon O. Ramirez
*Assistant Examiner*—Anita M. King
*Attorney, Agent, or Firm*—Edgar W. Averill, Jr.

[57] ABSTRACT

A holder for securing a printed circuit board in an edge connector on a mother board in a computer having a cover. The holder body is secured to the top of an installed printed circuit board. An adjustable post is held by the holder and is adjusted so that the head of the post extends slightly past the plane in which the computer cover rests. Next, the cover is installed depressing the head. The head is spring loaded on the post, thereby providing a continuous force on the printed circuit board to hold into the edge connector on the mother board.

16 Claims, 5 Drawing Sheets

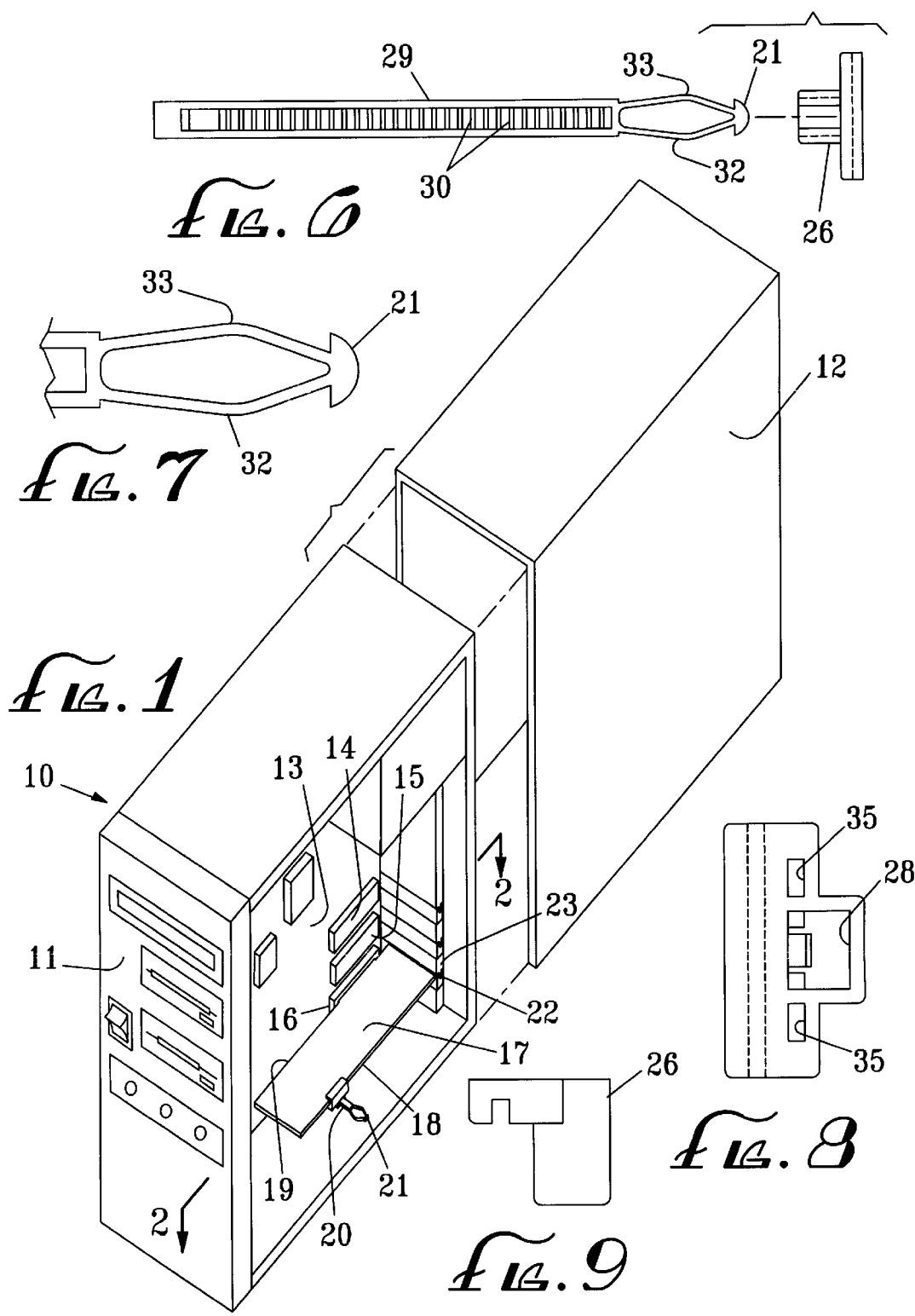

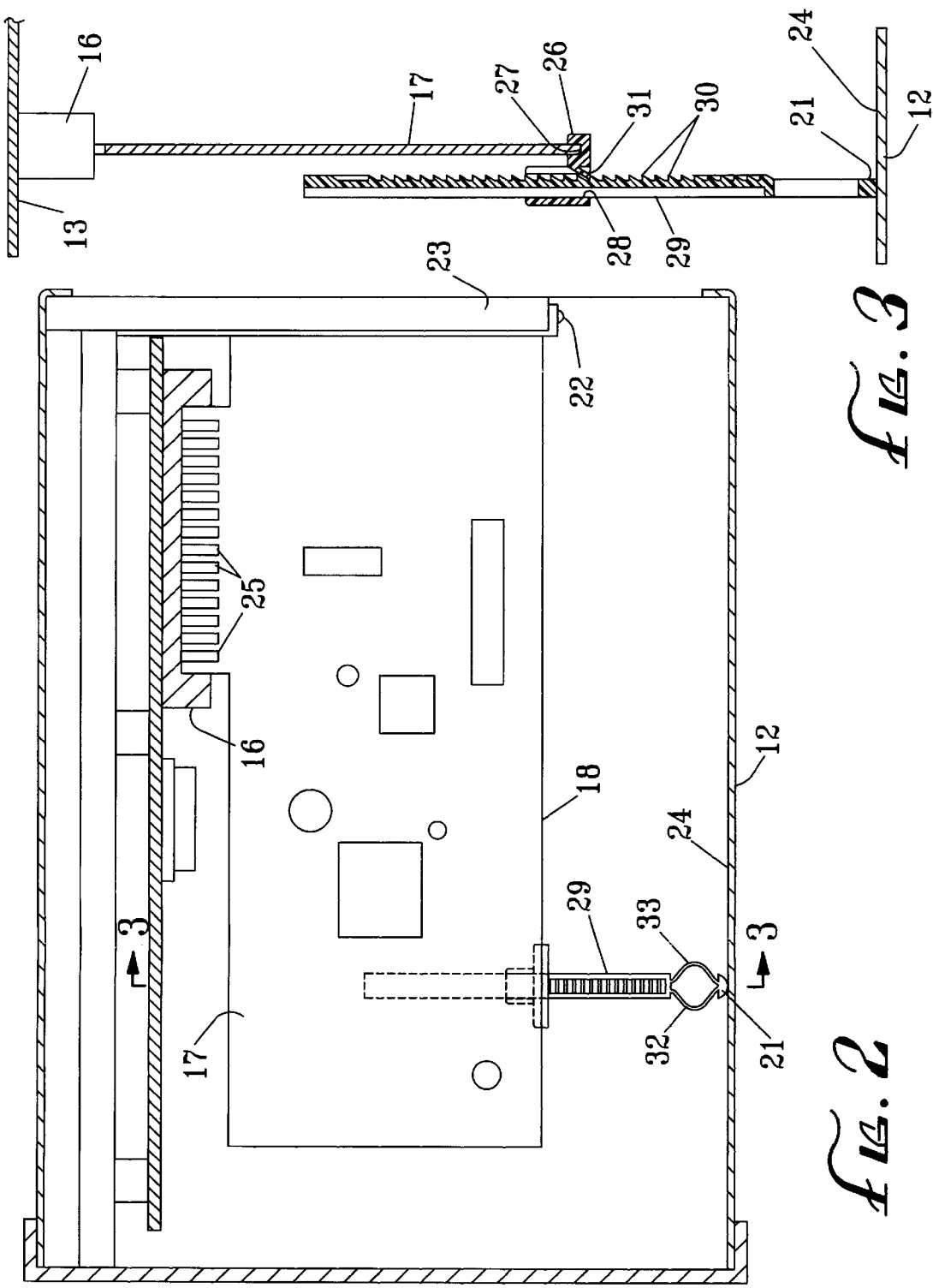

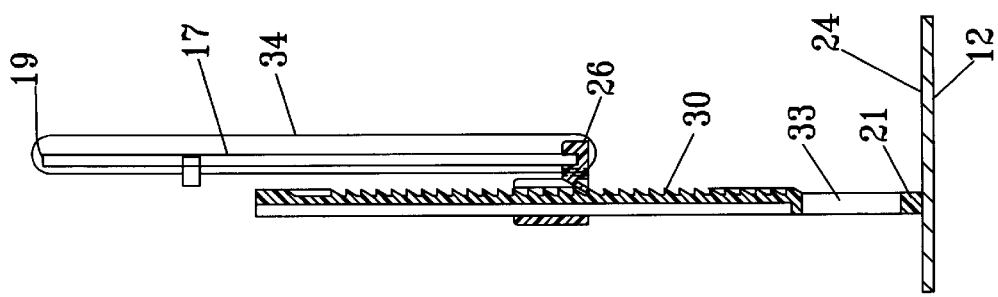
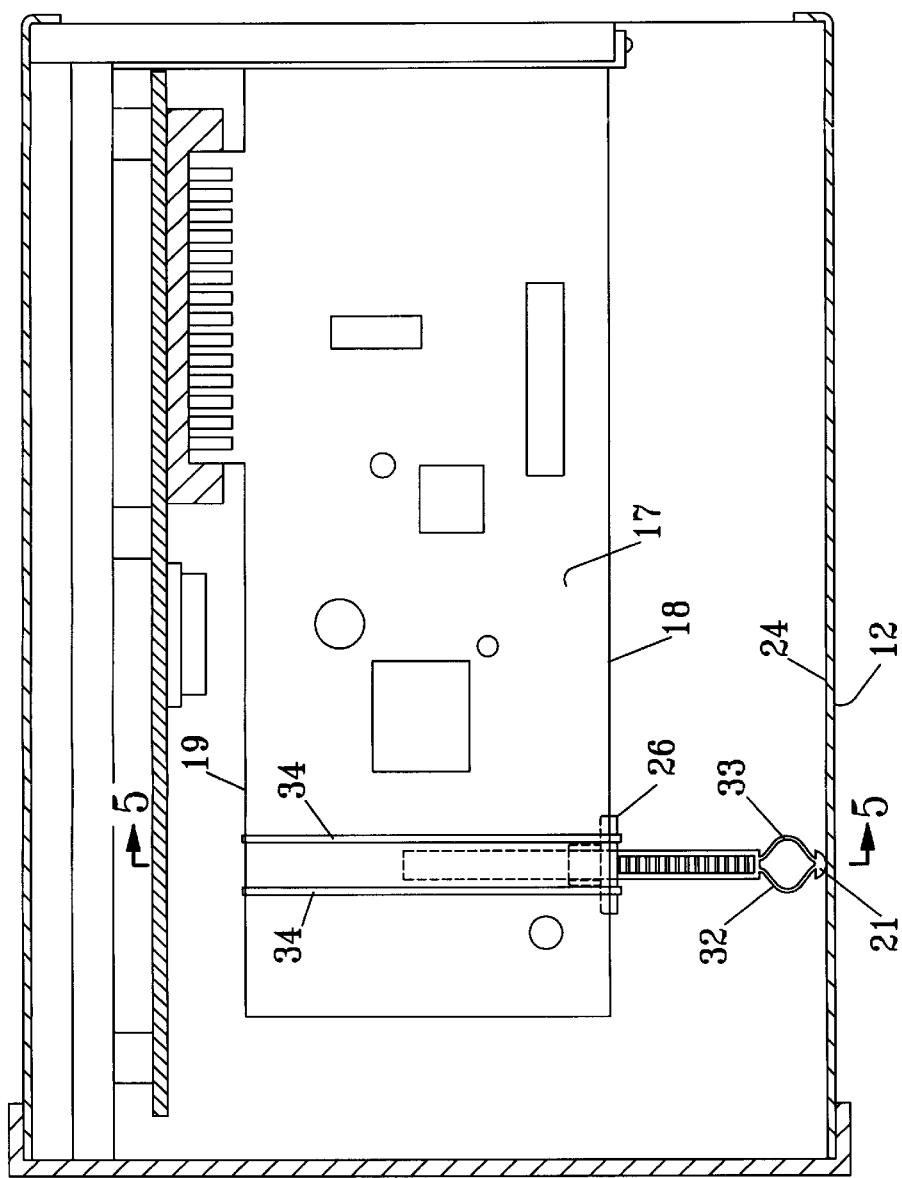

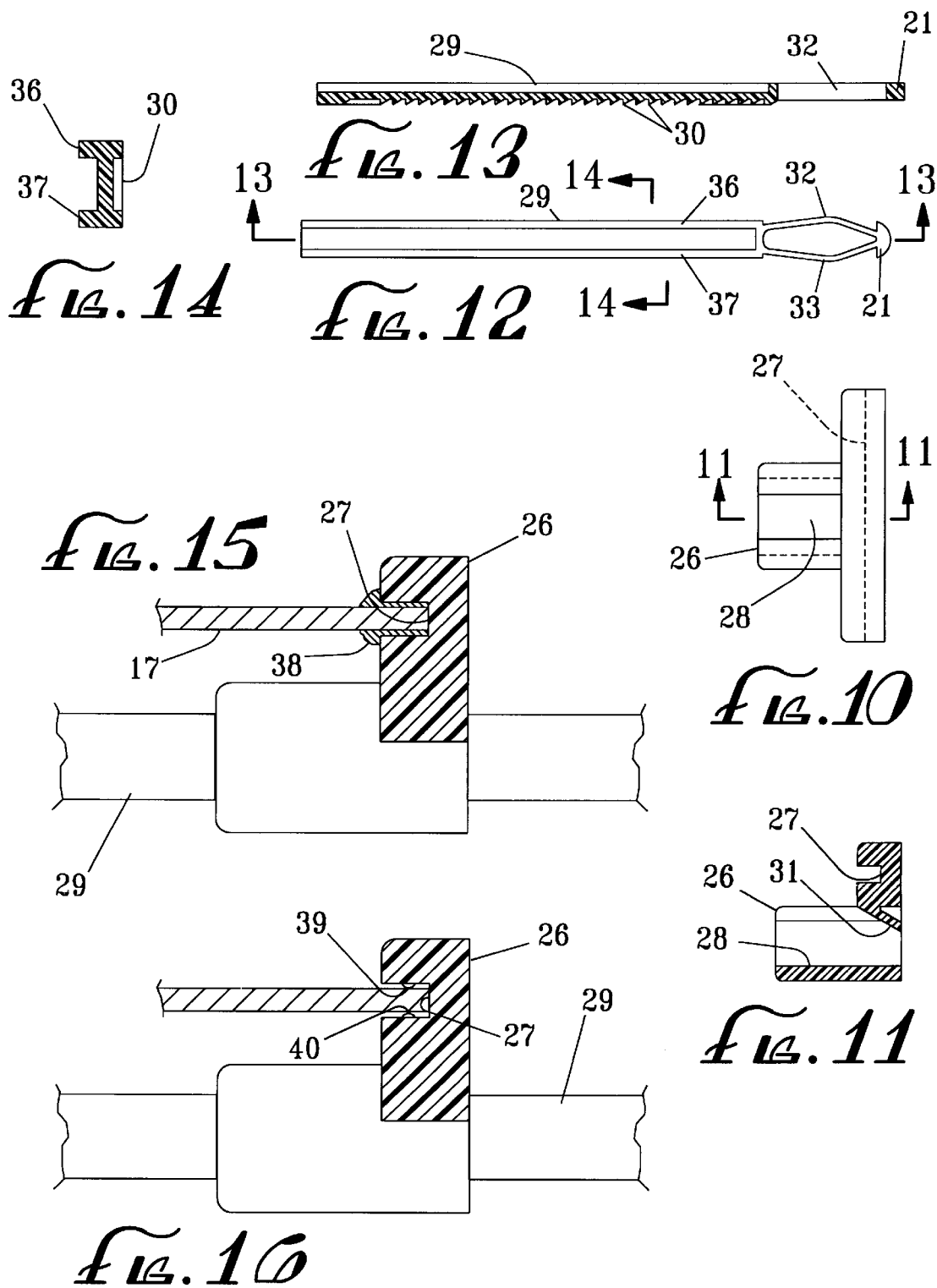

COMPUTER CARD RETAINER AND PROCESS FOR USING THE SAME

BACKGROUND OF THE INVENTION

The field of the invention is computer accessories and the invention relates more particularly to the problem of holding a printed circuit board in an edge connector on a mother board of a computer in spite of vibration.

Add-in cards are invariably used in computers for purposes such as holding a modem, a sound card, or other circuits. The printed circuit boards have one edge which extends below the bottom of the card and has a plurality of gold fingers on its sides. This edge with its gold fingers are pressed into the slot of an edge connector which has contacts which press against the gold fingers. One edge of the card is held down by a screw which passes through a slot in a metal tab affixed along one edge of the card. The other edge of the card, however, is typically unsupported and when a computer is shipped, it is often subjected to a great deal of vibration and the far edge of the card away from the screw can work its way out so that the electrical contacts between the gold fingers and the contacts of the edge connector may be compromised. Depending on the degree of severity of the contact compromise, it may result in a total loss of contact, meaning the add-in card jumped out of the edge connector slot; or intermittent contact, meaning that there are still some contacts between the gold fingers and the contacts of the edge connector, but the contact has been compromised to the degree that it is no longer reliable. This could cause the computer to malfunction. Failures of this nature are troublesome for diagnostic quality and repair reasons because the imperfect contact can work some of the time and fail some of the time, and is thus not easy to diagnose, or the failure to make good contact can make it difficult to pinpoint the root cause of the failure, such as a bad component, a bad circuit design, and the like.

Various approaches have been taken to try to solve this problem. One such approach is shown in U.S. Pat. No. 4,890,198. This patent shows a notched retainer which clips on the outer edge of the printed circuit board. A retainer is then trimmed to a length where it abuts the housing of the computer, thereby holding the circuit board in place.

U.S. Pat. No. 5,623,396 utilizes an elongated rod which has an adjustable hold-down fastener which is held between the rod and the top of the circuit board. A rod must be held above the circuit board in order for this device to function.

U.S. Pat. No. 5,303,793 uses a ratcheted card holder which is held to a post which is secured to the side of the edge connector. However, with most personal computers, there is no slotted clamp along the side of the edge connector. Also, the room between adjacent edge connectors often would not permit the securing of such a member.

Another approach is shown in U.S. Pat. No. 5,603,628 where a tie down strap is secured at both ends to the edge connector and tightened to hold the card in place. Once again, the edge connectors do not come with a place to hold such a tie down strap.

An expandable thermal-clamp is shown in U.S. Pat. No. 5,472,353 which clamp includes a spring. This clamp presses against the bottom edge of the card to hold it against the contacts. However, the conventional edge card does not have room for such a device.

BRIEF SUMMARY OF THE INVENTION

It is an object of the present invention to provide a holder for securing a printed circuit board in an edge connector which holder can be used on printed circuit boards of different sizes which holder is inexpensive to fabricate and easy to use.

The present invention is for a holder for securing a printed circuit board in an edge connector in a mother board in a computer with a cover. The printed circuit board has an outer edge on the side opposing a plug-in side. The holder has a holder body which can be affixed to the outer edge of a board to be secured. A post is held by the holder body and has a head which may be positioned so that when the holder is placed on a printed circuit board, and the computer cover is installed, the head is moved downwardly. Means are provided for biasing the head so that when it is moved downwardly it places a continued biasing force against the outer edge of the printed circuit board, thereby holding it in place. Preferably, the means for biasing the head is an integral leaf spring. Preferably, the means for adjusting the height of the post is a ratchet assembly having teeth on the post and a pawl on the holder.

The present invention is also for the process of using the holder comprising the steps of placing a biased post on an upper edge of a printed circuit board. Next, the height of the head is adjusted so that it extends a reasonable distance, such as between 1/8" and 1/2", past a plane in which the inner surface of a cover rests when installed. Next, the cover is placed on the computer, thereby compressing the head and creating a continuous biasing force against the outer edge of the printed circuit board.

DESCRIPTION OF THE DRAWINGS

FIG. 1 is an exploded perspective view of a personal computer with the cover removed and containing a printed circuit board with the holder of the present invention affixed thereto.

FIG. 2 is a view taken along line 2—2 of FIG. 1.

FIG. 3 is a cross-sectional view taken along line 3—3 of FIG. 2.

FIG. 4 is an enlarged side view of the holder of the present invention installed on a printed circuit board in a computer with the cover installed.

FIG. 5 is a side view of the holder and printed circuit board along line 5—5 of FIG. 4.

FIG. 6 is an exploded side view of the holder and holder body of the present invention.

FIG. 7 is an enlarged side view of the head of the holder of FIG. 6.

FIG. 8 is a top view of the holder body of FIG. 9.

FIG. 9 is a side view of the holder body of the holder of the present invention.

FIG. 10 is a rear view of the holder body of FIG. 8.

FIG. 11 is a cross-sectional view taken along line 11—11 of FIG. 10.

FIG. 12 is a back view of the post of the holder of the present invention.

FIG. 13 is a cross-sectional view taken along line 13—13 of FIG. 12.

FIG. 14 is a cross-sectional view taken along line 14—14 of FIG. 12.

FIG. 15 is a side view partially in cross-section of the holder body affixed to an edge of a circuit board by adhesive.

FIG. 16 is a side view partly in cross-section of the holder body held to the upper edge of a printed circuit board by friction points.

DESCRIPTION OF THE PREFERRED EMBODIMENTS

Figure 17:
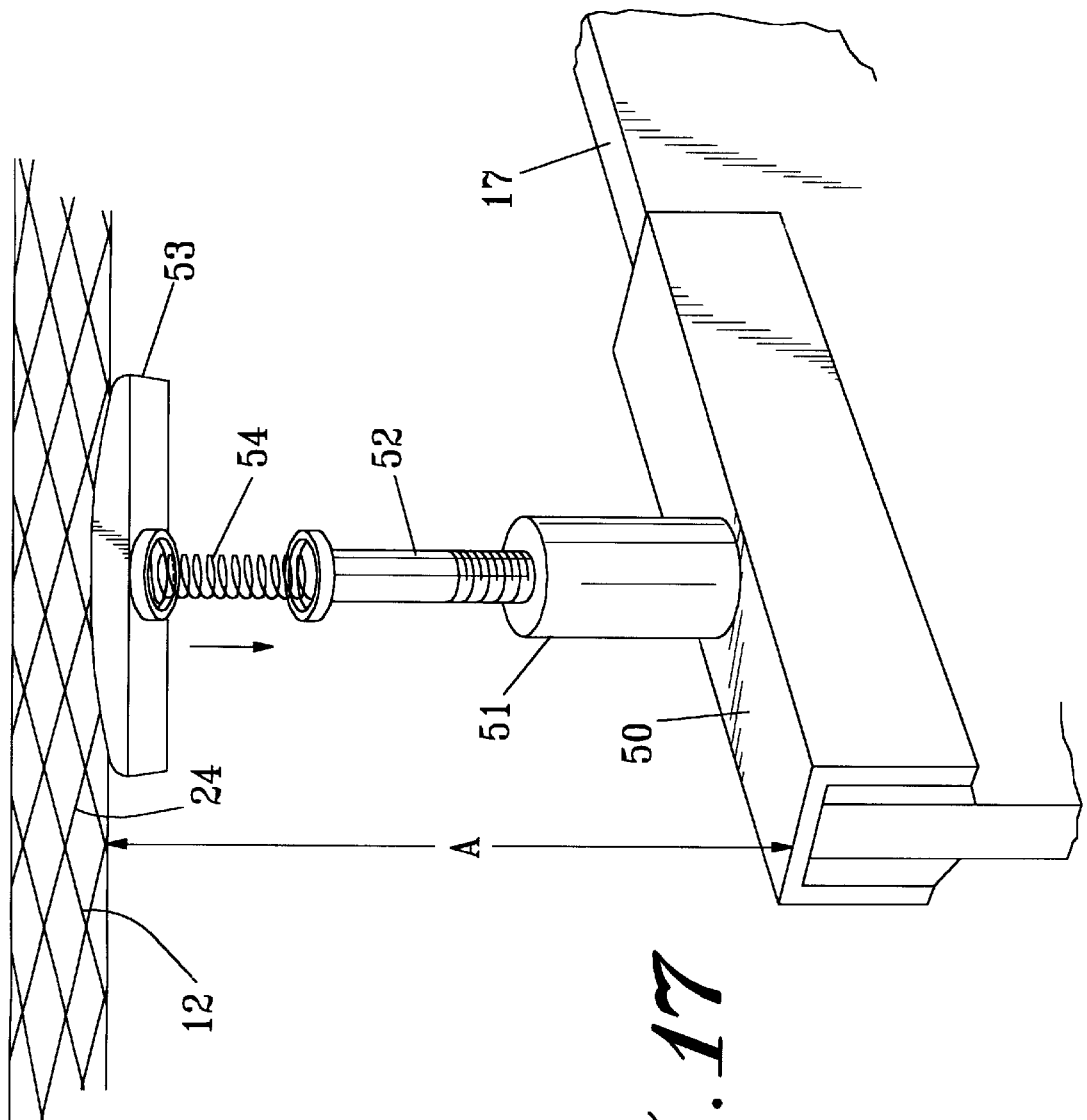
FIG. 17 is a perspective view of an alternate embodiment of the holder of the present invention.

FIG. 1 shows a conventional personal computer 10 which has a tower body 11 and a cover 12. While a tower style computer is shown in FIG. 1 it is to be understood that any style of computer with a cover can utilize the holder of the present invention. Computer 10 has a mother board 13 which has three slot or edge connectors 14, 15 and 16. Edge connector 16 holds an add-in circuit board 17. Printed circuit board 17 has an outer edge 18 and a plug-in side 19. The holder of the present invention is indicated by reference character 20 and is shown on the outer edge 18 of circuit board 17. Holder 20 has a biased head 21 which is mounted so that it extends slightly past a plane in which cover 12 rests. Thus, when the cover is installed, the biased head 21 is moved in a direction of edge connector 16, thereby providing a continuous downward force on board 17. Board 17 has a metal bracket 22 which is screwed into the case 23.

The apparatus with an installed cover is shown in cross-sectional view in FIG. 2 where it can be seen that the head 21 is pressing against the inner surface 24 of cover 12. Also shown in FIG. 2 is a plurality of gold fingers 25 which provide electrical contact between circuit board 17 and the circuitry on mother board 13.

Some of the details of the construction of the holder 20 of the invention is shown in FIG. 3. There it can be seen that holder 20 has a holder body 26 which has a slot 27 which rests against the outer edge 18 of circuit board 17. Holder body 26 also has a channel 28 into which post 29 is inserted. Post 29 has a series of teeth 30 which form a ratchet with pawl 31. Thus, it can readily be seen that post 29 can be moved in the direction of cover 12 an amount so that the head 21 extends beyond the plane which is coincident with the inner surface 24 of cover 12. In this way when the cover is installed, the pair of leaf springs 32 and 33 are bent, thereby providing an outward bias force to head 21 against inner surface 24 and this, of course, urges the circuit board 17 toward the edge connector 16. This prevents the unintended disconnection of the circuit board due to vibration during shipping or handling. Also, in some installations, the computer will be installed on a machine which itself provides vibrations.

There are several ways of assuring that the holder body 26 stays in a desired position on circuit board 17. One such approach is shown in FIGS. 4 and 5 where a pair of tie down straps 34 are passed through holder body 26 and around the inside 19 of circuit board 17. These tie down straps are passed through openings 35 shown best in FIG. 8 of the drawings.

It is preferable that the post be generally in the shape of an I-beam shown best in FIG. 14 of the drawings, having a pair of cross portions 36 and 37 to provide stiffness to the post in the event it is necessary to extend it a great distance from holder body 26.

Several alternate means are shown in FIGS. 15 and 16 for assuring that holder body 26 remains securely on the outer edge 18 of the printed circuit board. In FIG. 15 the slot 27 of holder body 26 is secured to the top circuit board 17 with an adhesive 38. A preferable holder body member is shown in FIG. 16 where a plurality of points 39 and 40 are formed on inner surface of slot 27.

In the event that the post is ratcheted to far through the holder body 26, it can be completely removed and reinserted into the bottom of channel 28 since the leaf springs 32 and 33 can readily be moved inwardly to permit its passage upwardly into channel 28.

Alternative means may be provided to retract pawl 31 so that this inner movement can be accomplished without removing the post from the channel.

One of the advantages of the configuration shown in FIGS. 1 through 16 is that it can be injection molded from just two pieces of plastic. The polymer used to fabricate these two pieces should be one which has substantial strength and toughness and it has been found that nylon is useful for these parts. It is also important that the head 21 have a rounded outer end so that it will easily slide along the inner surface 24 of the cover when the cover is being installed. Other biasing methods may be used in place of leaf springs 32 and 33. An alternative configuration can be as shown in FIG. 17 where a holder body 50 supports a threaded connector 51 into which a threaded post 52 is adjustably inserted. A head assembly 53 is affixed at the upper end of threaded post 52 and includes a spring 54 to provide a pressing action against head 53 as it contacts the inner surface 24 of the cover 12. Spring 54 also serves to support the head 53 above post 52. Of course, the ratcheted post and pawl arrangement discussed above may be used with the helical spring 54. Spring 54 is preferably plastic coated to avoid any possible electrical conductivity.

The process of the present invention is carried out by first installing the printed circuit board into the edge connector 16 and affixing the metal bracket to the case of the computer. Next, the holder of the present invention is placed so that its slot is against the outer edge of the printed circuit board. Next, the post is adjusted so that its biased head extends slightly past the plane in which the inner surface of the cover rests. This amount of extension is preferably between ⅛" and ½". Then the cover is installed, thereby depressing the head, thereby urging the holder against the outer edge of the printed circuit board.

While the retainer of the present invention has been discussed as being for holding a computer card in a personal computer, it can, of course, also be used to hold other circuit cards in other edge connectors in electronic devices other than computers. For instance, a home appliance can have a card which is subject to becoming dislodged and the retainer of the present invention can be used in this application also. Thus, when the term "holder for securing a printed circuit in an edge connector on a mother board" is stated, this is intended to mean any electronic card held in an edge connector of any device.

The present embodiments of this invention are thus to be considered in all respects as illustrative and not restrictive; the scope of the invention being indicated by the appended claims rather than by the foregoing description. All changes which come within the meaning and range of equivalency of the claims are intended to be embraced therein.

I claim:

1. A holder for securing a printed circuit board in an edge connector on a mother board in a computer with a cover connector having an internal surface said printed circuit board having an outer edge on a side opposing a plug-in side thereof, said holder comprising:

a holder body having means for supporting the body on the outer edge of said printed circuit board to be secured, said holder body having a post securing portion;

a post held by said post securing portion, said post having a head at an outer end thereof, said head being positionable so that when the holder is placed on said printed circuit board and the computer cover is installed, the head is moved downwardly; and means for biasing the head so that when the head is moved toward the holder body the head is biased outwardly so that when the holder is placed on the outer edge of the printed circuit board plugged into the mother board and the cover is installed, the head presses against the internal surface of the cover to provide a continuous biasing force between the internal surface of the cover and the outer edge of the printed circuit board.

2. The holder for securing a printed circuit board of claim 1 further including means for adjusting the distance the head is held away from said holder body.

3. The holder for securing a printed circuit board of claim 2 wherein said means for adjusting the distance the head is held away from said holder body is a ratchet comprising a pawl held by said holder body and said post has a plurality of teeth sloped to permit said post to be moved so that as the head moves away from said holder body the teeth move past the pawl and are capable of holding the post in a fixed position with respect to said holder body.

4. The holder for securing a printed circuit board of claim 1 wherein said means for biasing the head against the internal surface of the cover comprises at least one outwardly bowed leaf spring between said head and a top of said post.

5. The holder for securing a printed circuit board of claim 4 wherein said head is held to the top of said post by a pair of opposed outwardly bowed leaf springs.

6. The holder for securing a printed circuit board of claim 5 wherein said head is integrally formed with said pair of leaf springs which, in turn, are integrally formed with said post.

7. The holder for securing a printed circuit board of claim 6 wherein said head, pair of leaf springs and post are formed of a polymer.

8. The holder for securing a printed circuit board of claim 3 wherein said pawl is integrally formed in said body and said body is formed of a polymer.

9. The holder for securing a printed circuit board of claim 1 wherein said post is held on one side of said holder body and a portion of the post is adapted to extend adjacent a face of said printed board.

10. The holder for securing a printed circuit board of claim 1 further including an opening in said body sufficiently large for a strap to be inserted therethrough so that the body can be strapped on to the printed circuit board by passing a strap through said opening in said body and around the plug-in side of said printed circuit board.

11. A two piece holder for securing a printed circuit board in an edge connector on a mother board in a computer with a cover having an internal surface, said printed circuit board having an outer edge on a side opposing a plug-in side, said holder comprising:

a holder body having a slot supportable on the outer edge of the printed circuit board to be secured, said holder body having an opening adjacent a side of said slot, said opening supporting an upwardly directed pawl;

a post assembly having an elongated post beam, said post beam having a plurality of teeth formed on one side thereof, said post assembly being secured in said opening of said holder body so that the teeth thereof are contacted by said pawl, said post assembly also having a head formed in an upper end thereof, said head being held so that it may be moved inwardly toward said upper end in a biased manner whereby when said slot of said holder body is placed over an outer edge of the printed circuit board, the post may be ratcheted outwardly so that the head extends slightly past the plane in which the cover rests so that when the cover is installed, the head will be moved inwardly causing a continuous force against the outer edge of the printed circuit board.

12. The holder for securing a printed circuit board of claim 11 wherein the slot includes a plurality of protrusions large enough to press against the printed circuit board and hold the body in a fixed position on the outer edge of the board.

13. The holder for securing a printed circuit board of claim 11 wherein said head is held on said upper end in a biased manner by a pair of opposed leaf springs and wherein said leaf springs are sized so that they may be moved inwardly so that the head and leaf springs may pass through the opening in the holder body.

14. The holder for securing a printed circuit board of claim 13 further including at least one opening in said holder body sufficiently large for a strap to be inserted therethrough so that the body can be strapped on to the printed circuit board by passing the strap through said at least one opening in said body and around the plug-in side of said printed circuit board.

15. The holder for securing a printed circuit board of claim 11 wherein said head has a rounded outer surface.

16. A process for securing a printed circuit board in an edge connector on a mother board in a computer with a cover, said printed circuit board having an outer edge on a side opposing a plug-in side thereof, said process comprising the steps of:

placing a biased post on an upper edge of said printed circuit board;

adjusting a head of said biased post to a position so that an outer surface of said head extends slightly past a plane in which an inner surface of said cover rests when installed;

placing the cover on said computer thereby depressing the head and creating a continuous biasing force against the outer edge of said printed circuit board.

* * * * *